United States Patent [19]

Halliwell et al.

[11] Patent Number: 4,686,114
[45] Date of Patent: Aug. 11, 1987

[54] SELECTIVE ELECTROLESS PLATING

[76] Inventors: Michael J. Halliwell, 4435 Willow Mist Dr., Dayton, Ohio 45424; Joseph Zahavi, Technion Research & Development Foundation, Ltd., Israel Institute of Metals, Haifa, Technion City, Israel

[21] Appl. No.: 819,559

[22] Filed: Jan. 17, 1986

[51] Int. Cl.$^4$ .......................................... C23C 18/28
[52] U.S. Cl. .................... 427/53.1; 427/54.1; 427/55; 427/98; 427/306; 427/434.2; 427/443.1
[58] Field of Search ............ 427/54.1, 98, 306, 53.1, 427/55, 434.2, 443.1

[56] References Cited

U.S. PATENT DOCUMENTS

| 3,954,570 | 5/1976 | Shirk ................................. | 427/306 |
| 4,121,007 | 10/1978 | Kobayashi ........................ | 427/98 |
| 4,413,020 | 11/1983 | McKee ............................. | 427/53.1 |

FOREIGN PATENT DOCUMENTS 1324653  7/1973  United Kingdom ............. 427/306

OTHER PUBLICATIONS

Feldstein, "Selective Electroless Plating Techniques; A Survey", *Plating*, Aug. 1970.

*Primary Examiner*—John D. Smith
*Attorney, Agent, or Firm*—Charles E. Bricker; Donald J. Singer

[57] ABSTRACT

A method for deposition of metals onto a workpiece by applying a sensitizing solution to a workpiece, directing a high intensity optical beam onto the sensitized workpiece surface to flash evaporate sensitizer from the workpiece in areas which are not to be plated, and thereafter contacting the workpiece with an electroless plating solution to deposit a layer of metal in those areas from which the sensitizer is not flashed off.

15 Claims, 3 Drawing Figures

SELECTIVE ELECTROLESS PLATING

RIGHTS OF THE GOVERNMENT

The invention described herein may be manufactured and used by or for the Government of the United States for all governmental purposes without the payment of any royalty.

BACKGROUND OF THE INVENTION

This invention relates to metal plating, particularly, electroless metal plating.

While it is possible to produce high resolution patterns by electroless deposition techniques wherein masking is employed to delineate the pattern, such plating processes require multiple steps. It is necessary to employ a photoresist to mask the surface, to selectively expose the photoresist mask, to plate the surface, and finally, to strip the mask. This process is a multistep process.

It is known to expose a substrate immersed in an electroless plating solution to a high intensity light source to enhance the plating rate. While this technique increases the plating rate, it is not well suited for preferentially plating patterns since there will be a mixing of the activated solution with the nonactivated solution, thus reducing the resolution of any plated pattern.

It is also known to coat a surface to be plated with a sensitizing solution. The coated surface is exposed to light to form a catalytic layer capable of catalyzing the deposition of metal thereon from an electroless metal deposition solution.

We have discovered a novel method for selective electroless plating.

Accordingly, it is an object of the present invention to provide a novel method for selective electroless plating.

Other objects and advantages of the present invention will be apparent to those skilled in the art from a reading of the following description of the invention.

SUMMARY OF THE INVENTION

In accordance with the present invention there is provided a method for selectively plating a metal onto a workpiece which comprises, in combination, the steps of applying a sensitizing solution to the workpiece, directing a pulsed noncoherent optical energy source onto the workpiece in the area which is not to be plated, and thereafter contacting the workpiece with an electroless plating solution to achieve plating thereon.

DETAILED DESCRIPTION OF THE INVENTION

Figure 1:
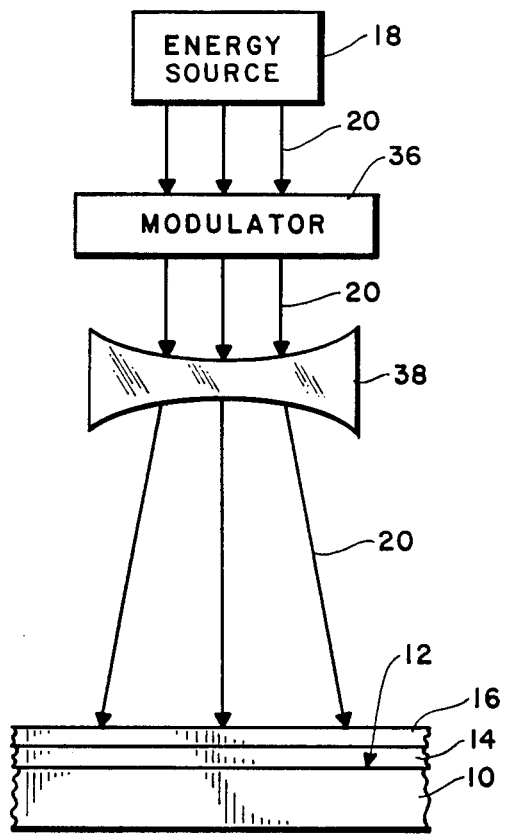
FIG. 1 is a schematic showing a noncoherent optical energy source directed onto a workpiece having a mask.

The practice of electroless plating in accordance with this invention will be described with reference to the drawings. There is shown in FIG. 1 a workpiece 10 having a surface 12 whereon plating is desired. The surface 12 has a finite layer 14 of sensitizer applied thereto. The sensitizer or activator is a conventional one, such as a $PdCl_2$—$SnCl_2$—HCl solution, or the like. A photomask 16 having a desired pattern is disposed in intimate contact with the sensitizer layer 14. An intense light source 18, such as a mercury vapor lamp, xenon flash lamp or carbon arc or the like, is so positioned that when operating it directs an intense beam of light 20 through the mask 16 onto the sensitizer layer 14. Any portion of the light beam 20 passing through the mask 16 flash evaporate sensitizer from the workpiece surface 12, leaving a non-sensitized area. Conversely, those areas of the surface 12 where the beam 20 is prevented from passing through the mask 16 remain sensitized.

The mask 16 is thereafter removed from the workpiece 10 and the sensitized surface 12 of workpiece 10 is contacted with an electroless plating solution, for a time sufficient to achieve a desired thickness of metal plated thereon.

Figure 2:
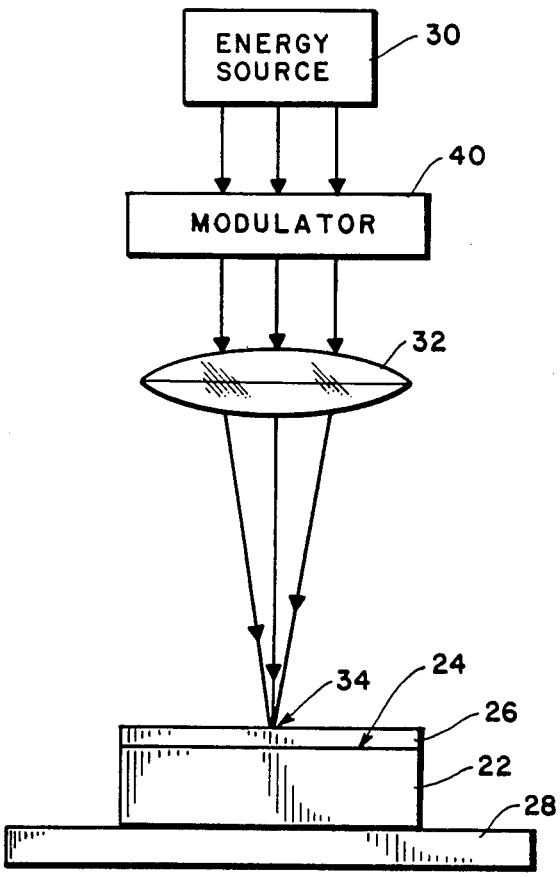
FIG. 2 is a schematic showing a noncoherent optical energy source directed through a lens onto a workpiece located on an X-Y table; and, FIG. 3 is a schematic showing a continuous electroless plating process in accordance with the invention.

FIG. 2 illustrates an alternative embodiment of the invention wherein a mask is not employed. Instead, a workpiece 22 having a surface 24 with a layer of sensitizer 26 applied thereto is positioned on an X-Y table 28. An intense light source 30 is focused through a focusing system, illustrated as as single lens element 32, to provide point source illumination 34 on the sensitizer layer 26. Movement of the table 28 in the x and the y directions allows selective removal of sensitizer from the surface 24.

Referring again to FIG. 1, the light source 18 can be any source capable of providing radition in the range of visible to near infrared. As mentioned previously, example sources include carbon arc and mercury vapor sources. The intensity of the light source should be sufficient to provide a beam 20 of at least about 0.01 megawatt per square centimeter.

The beam 20 emitted from the energy source may be modulated by a modulator 36 which may be placed between the energy source 18 and a lens system 38, or alternatively between the lens system 38 and the workpiece 10. The modulator 36 may be a mechanical light dropper when the modulation rate is low, or an optical modulator can be employed when more rapid modulation is desired.

The embodiment shown in FIG. 2 may also comprise a modulator 40 interposed between the energy source 30 and the lens system 32.

Figure 3:
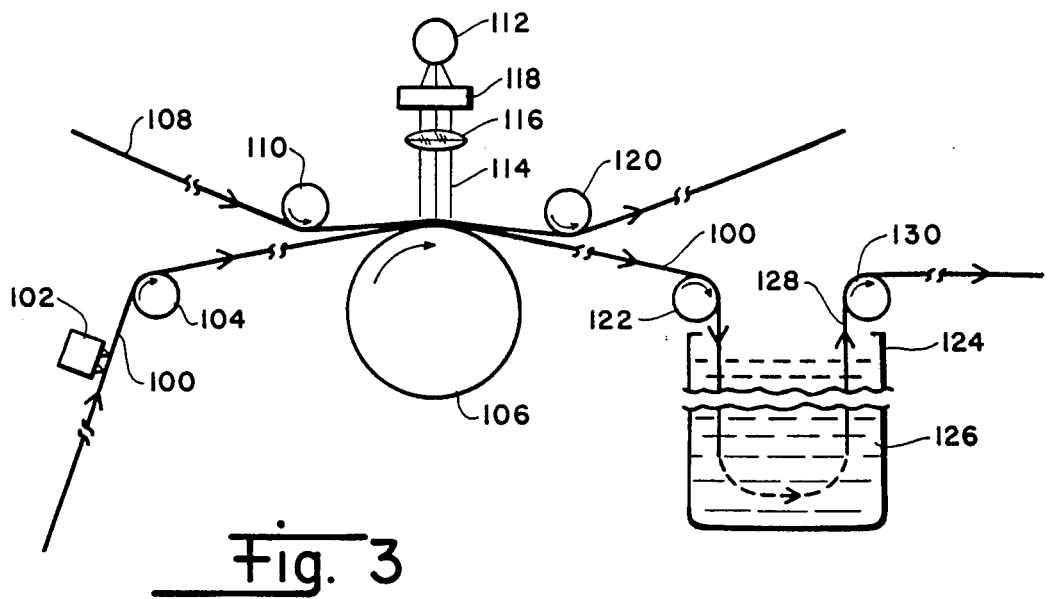

The process of this invention can be carried out in continuous fashion, as shown in FIG. 3. A flexible substrate 100, such as a polyimide film, is taken from a source, not shown, and passed in contact with a sensitizer applicator means 102 where a film of sensitizer is applied to the film. The thus-sensitized film is passed over an idler roller 104, thence over exposure roller 106. At the same time, a flexible photomask 108 is taken from a source, not shown, passed over an idler 110, thence over exposure roller 106 in contact with the sensitized film 100. An intense light source 112 is so positioned that it directs an intense beam of light 114 through the mask 108 onto the sensitized film 100. The light beam 114 may focused by the lens system 116 and may be modulated by a modulator 118. The portion of the light beam 114 which passes through the mask 108 flash evaporates sensitizer from the sensitized film 100 as described previously. The photomask is then separated from the now pattern-sensitized film 100, passed over idler roller 120 and taken up by take-up means, not shown. The photomask 108 may be in the form of a continuous loop so that it runs continuously through the apparatus.

Following separation from the photomask 108, the pattern-sensitized film 100 is passed over an idler roller 122 and into a plating tank 124 which contains an electroless plating solution 126. The film is maintained in contact with the electroless plating solution 126 for a time sufficient to achieve a desired level of plating. The plated film, now designated as item 128 is removed from contact with plating solution 126 and passed over idler roller 130 for further processing, such as washing, drying, cutting into individual circuit strips, etc.

Various modifications may be made to the present invention without departing from the spirit thereof or the scope of the appended claims.

We claim:

1. A method for selectively plating a metal onto a workpiece which comprises, in combination, the steps of applying a sensitizing solution to said workpiece, thereby providing a sensitized workpiece, directing a pulsed noncoherent optical energy source onto said workpiece in an area which is not to be plated whereby said said sensitizer is flash evaporated from said sensitized workpiece in said area, and thereafter contacting said workpiece with an electroless plating solution to achieve plating thereon.

2. The method of claim 1 wherein said sensitizer is a $PdCl_2$—$SnCl_2$—HCl solution.

3. The method of claim 1 wherein said energy source has an intensity of at least about 0.01 megawatt per $cm^2$.

4. The method of claim 1 wherein said area not to be plated is defined by a photomask.

5. The method of claim 1 wherein said energy source is a carbon arc lamp modulated by a mechanical chopper.

6. The method of claim 1 wherein said energy source is a mercury vapor lamp.

7. The method of claim 1 wherein said workpiece is a flexible, polymeric film.

8. The method of claim 7 wherein said film is a polyimide.

9. The method of claim 1 wherein said area not to be plated is defined by moving said workpiece relative to said energy source to selectively remove said sensitizer from said workpiece.

10. A method for continuously plating a metal onto a workpiece which comprises, in combination, the steps of coating a linearly moving flexible workpiece with a sensitizer, positioning a linearly moving photomask in contact with the thus-sensitized workpiece, moving said sensitized workpiece and said photomask thrugh an intense beam of light positioned so that the said beam is directed onto said mask and through selected portions thereof onto said workpiece, whereby the portion of light passing through said selected portions flash evaporates said sensitizer from said sensitized workpiece, separating said photomask from the resulting pattern-sensitized workpiece, and contacting said pattern-sensitized workpiece with an electroless plating solution for a time sufficient to achieve a desired level of plating thereon.

11. The method of claim 9 wherein said sensitizer is a $PdCl_2$—$SnCl_2$—HCl solution.

12. The method of claim 9 wherein said intense beam has an intensity of at least about 0.01 megawatt per $cm^2$.

13. The method of claim 11 wherein said beam is produced by a carbon arc.

14. The method of claim 11 wherein said beam is produced by a mercury vapor lamp.

15. The method of claim 9 wherein said workpiece is a polyimide film.

* * * * *